June 24, 1958 L. J. BATEMAN 2,840,806

VOLTAGE STATE TO DIGITAL CONVERTER

Filed Oct. 12, 1955 2 Sheets-Sheet 1

LEE J. BATEMAN
INVENTOR

BY Henry Heyman
ATTORNEY

June 24, 1958 L. J. BATEMAN 2,840,806

VOLTAGE STATE TO DIGITAL CONVERTER

Filed Oct. 12, 1955 2 Sheets-Sheet 2

LEE J. BATEMAN
INVENTOR

BY Henry Heyman
ATTORNEY

United States Patent Office 2,840,806

Patented June 24, 1958

2,840,806

VOLTAGE STATE TO DIGITAL CONVERTER

Lee J. Bateman, Los Angeles, Calif., assignor to Hughes Aircraft Company, Culver City, Calif., a corporation of Delaware Application October 12, 1955, Serial No. 540,117

7 Claims. (Cl. 340—347)

This invention relates generally to converters and, more particularly, to a system for converting voltage levels to digital information which employs transistors as active circuit elements.

Conversion of direct-current voltages of varying amplitude, such as would be obtained from a potentiometer having variable shaft positions, an accelerometer, or like device, to pulse signals representing digital information has long been a problem in many fields, such as for example the computer and telemetering fields.

Several methods of accomplishing analog-to-digital conversion have been advocated. One method used in the prior art for analog-to-digital conversion is disclosed in "Trends in Computers: Automatic Control and Data Processing," published by American Institute of Electrical Engineers, April 1954, in an article on page 128 entitled, "A shaft-to-digital encoder," by B. M. Gordon, M. A. Meyer, and R. N. Nicola. The system disclosed in this article is basically mechanical in operation, relying upon shaft rotation being transmitted accurately through a gear train and ultimately converted into digital signals.

Another analog-to-digital conversion system is disclosed in the same publication on page 118 in an article entitled, "A high speed multi-channel analog-digital converter," by James M. Mitchell. Although the system as disclosed in this article is basically electronic in operation and has the inherent speed and accuracy of such systems, there are some disadvantages which would tend to prevent its use. The system uses vacuum tubes as its active circuit elements in conjunction with relays which provide sampling of the direct-current signals to be converted.

Accordingly, an object of the present invention is to provide a novel means for accurately converting voltage-state signals or shaft positions to digital information.

Another object of the present invention is to provide an analog-to-digital converter employing transistors as active circuit elements which will accurately convert relatively small voltage-state signals into digital information at high speeds and which consumes a relatively small amount of power.

A further object of the present invention is to provide an analog-to-digital converter which is fully electronic in operation and which utilizes a relatively small number of circuit elements, thus minimizing cost of production and maintenance.

A voltage-state to digital-signal converter in accordance with the present invenion employs a flip-flop having two input and two output terminals for control purposes. Connected to one of the input terminals is a source of control signals and to the other input terminal is connected a voltage comparator. The comparator has connected to it a reference signal source and a source of voltage state to be converted. One output terminal of the flip-flop is connected to the reference signal source and is used to control the time of comparison. The other flip-flop output terminal is connected to means for passing a continuously recurring signal, as is a source of such signals.

Upon application of a control signal, the flip-flop changes from one of its stable states to the other. The recurring signals are then passed by the passing means until a predetermined relationship between the reference signal and the voltage state occurs, whereupon the comparator produces an output pulse which causes the flip-flop to return to its original state and the recurring signals to cease passing.

The novel features of the present invention are set forth in particularity in the appended claims. Other and more specific objects will become apparent from a consideration of the following description taken in conjunction with the accompanying drawings in which like components are designated by the same reference characters and in which:

Figure 1:
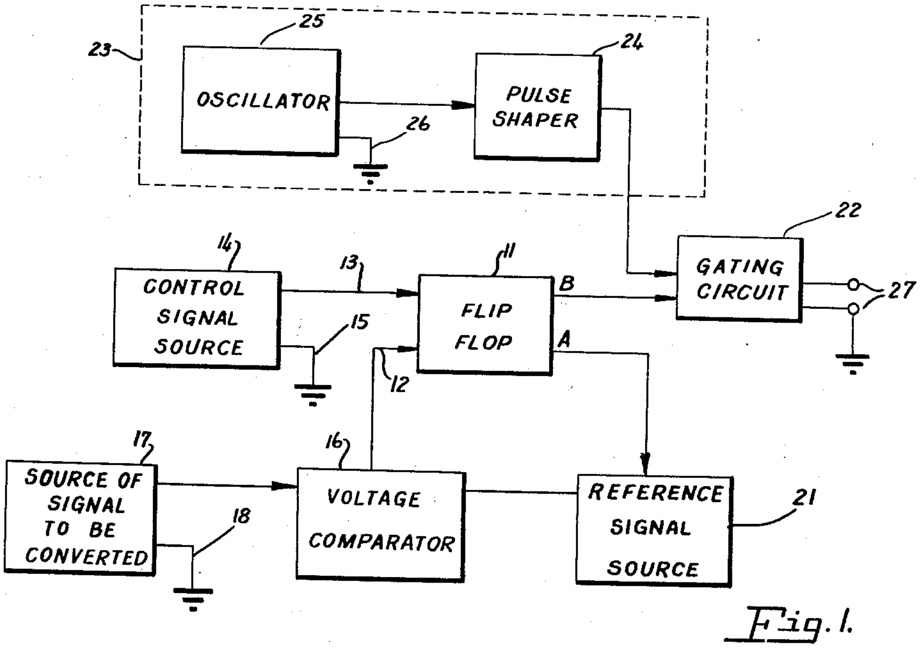
Fig. 1 is a schematic block diagram of the analog-to-digital converter of the present invention.

Referring now to the drawings and, more particularly, to Fig. 1, there is shown a flip-flop illustrated by rectangle 11 which has two input terminals 12 and 13 and two output terminals indicated by the reference characters A and B. A control signal source 14 having a terminal 15 which is grounded is connected to input terminal 13 of flip-flop 11. A voltage comparator 16 is connected to input terminal 12 of flip-flop 11. A source 17 of a signal to be converted having a terminal 18 which is grounded is connected to voltage comparator 16 while a reference signal source 21 is connected between output terminal A of flip-flop 11 and voltage comparator 16. A gating circuit represented by rectangle 22 is connected to output terminal B and includes output terminals 27, one of which is grounded. Also connected to gating circuit 22 is a source of continuously recurring signals which is represented by dashed rectangle 23 and which includes an oscillator 25 having a terminal 26 which is grounded and which is connected to a pulse shaper 24.

Figure 2:
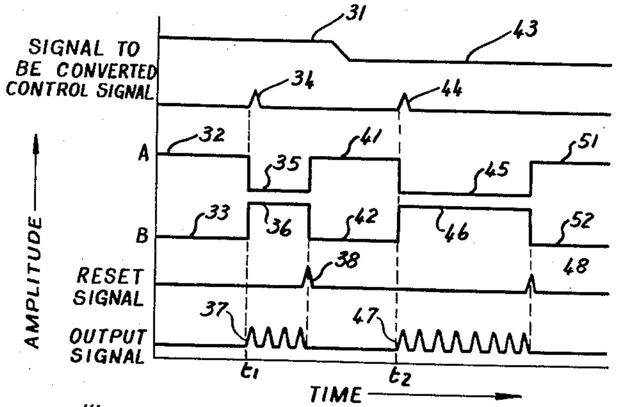
Fig. 2 is a graph illustrating waveforms taken at various points throughout the converter of Fig. 1.

In discussing the operation of the circuit of Fig. 1, reference is now made to Fig. 2 wherein the abscissa represents time and the ordinate amplitude. The curves shown on the graph of Fig. 2 from top to bottom were taken by measuring the voltage between the following points respectively; between the output of source 17 and ground, flip-flop input terminal 13 and ground, flip-flop output terminals A and B and ground, flip-flop input terminal 12 and ground, output terminals 27. Assume as a first example of operation that flip-flop output signal A is in its high state, as represented at 32 on Fig. 2, and that flip-flop output signal B is in its low state as shown at 33. The signal to be converted which is applied to voltage comparator 16 is as shown at 31. Also assume that signals from the recurring signal source 23 are being continuously applied to gating circuit 22, but that the state of output signal B from flip-flop 11 is such that no signals appear at gating circuit output terminals 27.

If at some time, for example $t_1$, as shown on Fig. 2, a control signal such as 34 is applied to flip-flop input terminal 13, the output signals A and B will reverse their states as shown at 35 and 36 on curves A and B of Figure 2. When output signal B changes to its high state 36, as shown on Fig. 3, the gating circuit begins to allow the continuously recurring signal 37 from source 23 to pass and appear at output terminals 27. When flip-flop output signal A changes to its low state 35 reference signal source 21 applies a signal-to-voltage comparator 16 which is compared to the signal to be converted from source 17. When the two signals become substantially equal, the voltage comparator produces a pulse, such as that shown on the reset signal curve at 38 of Fig. 2. Pulse 38 is applied to input terminal 12 of flip-flop 11 and causes the flip-flop output signals to reverse their states, returning to their original positions, as shown at 41 and 42 on Fig. 2. When flip-flop output signal B returns to its low state 42 the gating circuit is prevented from passing further recurring signals and as flip-flop output signal A returns to its high state 41, the reference signal which was applied to voltage comparator 16 is removed.

During the period of time between the application of control signal 34 and reset signal 38, a number of the continuously recurring signals from source 23 appear as an output signal 37 across terminals 27 of gating circuit 22. The number of these pulses which appear is indicative of the amplitude or voltage state of the signal to be converted from source 17. These output pulses may be utilized as they appear or may be applied to a counter or like circuit for further conversion to a digital signal such as binary 1's and 0's and may then be subsequently applied as an intelligence input signal to a digital computer or the like.

If at a later time the signal to be converted increases in amplitude in a negating direction, for example as shown at 43 on Fig. 2 and at some later time, such as $t_2$, another control signal as shown at 44 is applied to input terminal 13 of flip-flop 11, the same cycle of events as that just described in the above paragraph will occur. Flip-flop output signals A and B will change states as shown at 45 and 46, allowing a series of recurring signals from source 23 which are indicative of the amplitude of the signal to be converted to appear at output terminals 27 of gating circuit 22 as shown at 47. Subsequently, upon application of reset signal 48, the flip-flop output signals A and B will reverse states as shown at 51 and 52 and the recurring signals will cease to appear as an output signal. It will be noted that a larger number of pulses appears during the interval of time between the occurrence of control signal 34 and that of reset signal 48, thus indicating that the signal to be converted had increased in amplitude. If the signal to be converted had decreased in amplitude, for example from a negative value in a positive direction toward zero voltage, a shorter duration of time would have occurred between the control signal and the reset signal and a smaller number of pulses would have appeared at output terminals 27.

Figure 3:
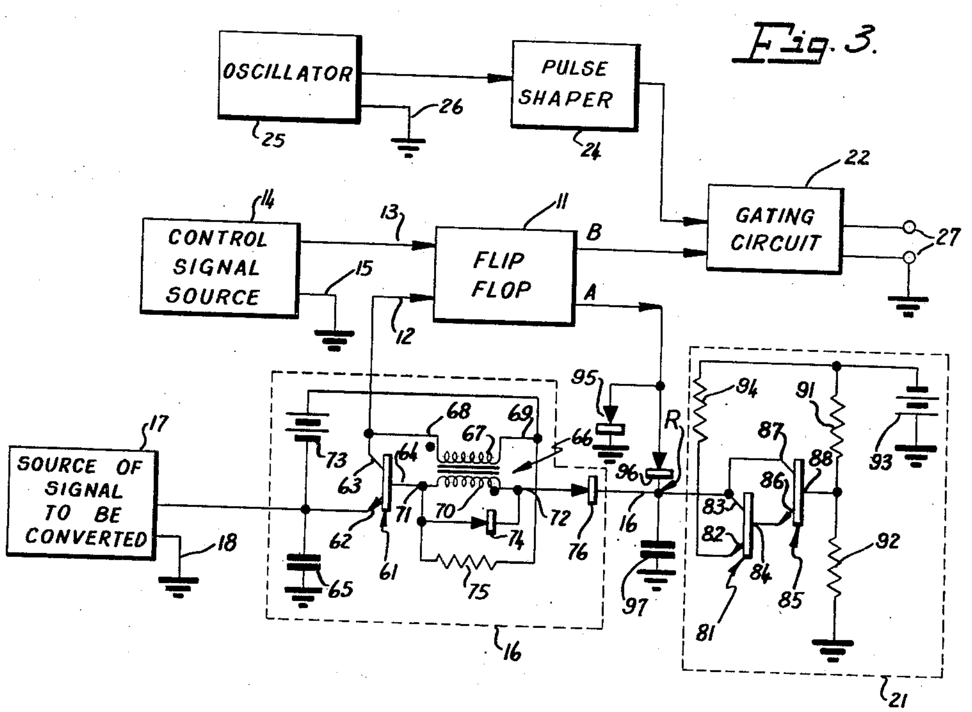
Fig. 3 is a schematic circuit diagram partly in block form illustrating one embodiment of the analog-to-digital converter of the present invention.

Referring now more particularly to Fig. 3, which illustrates in more detail the analog-to-digital converter of Fig. 1, comparator 16 is shown to include an N–P–N type transistor 61 represented by its conventional symbol which has an emitter 62, a collector 63, and a base 64. Connected between emitted 62 and ground is a capacitor 65 which is used to bypass to ground any noise present in the signal to be converted. A transformer 66 such as a pulse transformer is provided having a primary winding 67 which includes terminals 68 and 69, and a secondary winding 70 which includes terminals 71 and 72. Transformer secondary terminal 71 is connected to base 64, while terminal 68 is connected to collector 63. Connected between terminal 69 and emitter 62 is a source of operating potential 73. Transformer 66 is used as a regenerative feedback means to cause transistor 61 to produce an output pulse when the potentials upon its base and its emitter are substantially equal. Connected across secondary winding 70 is a diode 74 which is utilized to prohibit overshoot from occurring in secondary winding 70. A resistor 75 is connected between terminal 69 and base 64. Connected between reference signal source 21 and terminal 73 is a diode 76.

Reference signal source 21 is shown to include a transistor 81 having an emitter 82, a collector 83, and a base 84 and a second transistor 85 having an emitter 86, collector 87, and base 88. Emitter 86 is connected directly to base 84, while collectors 83 and 87 are interconnected. A voltage divider composed of resistors 91 and 92 is connected between the negative terminal of battery 93 and ground, the positive terminal of battery 93 also being connected to ground. Base 88 is connected to the junction between resistors 91 and 92 for supplying an operating potential to transistors 81 and 85. A resistor 94 is connected between emitter 82 and the negative terminal of battery 93 for supplying further operating potential to transistors 81 and 85. A charge storage means such as capacitor 97 is connected between collector 83 and ground. Reference signal source 21 as shown in Fig. 3 operates as a constant current generator.

Means for controlling the application of the reference signal from constant current source 21 to capacitor 97 is shown as diode 95 which is connected between flip-flop output terminal A and ground, and diode 96 which is connected between flip-flop output terminal A and collector 83. Diode 76 is also connected to collector 83. The remainder of the circuit of Fig. 3 is identical to that as shown in Fig. 1 as indicated by the use of identical reference characters.

Figure 4:
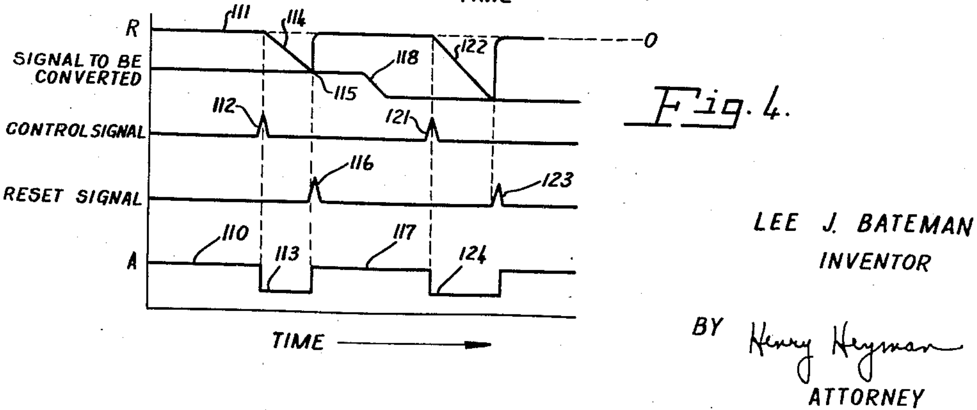
Fig. 4 is a graph illustrating waveforms taken at various points through the circuit of Fig. 3.

In discussing the operation of the circuit of Fig. 3 reference is now made to Fig. 2 and to Fig. 4. The abscissa of Fig. 4 represents time while the ordinate represents amplitude. Curve R of Fig. 4 is taken by measuring the voltage between point R of Fig. 3 and ground, that is across capacitor 97. The remainder of the curves of Fig. 4 are taken at the same points as those curves of Fig. 2 having like symbols.

The particular connection of transistors 81 and 85 of Fig. 3 yields a constant current generator, the current of which is controlled by the voltage present on base 88 of transistor 85 and emitter 82 of transistor 81. The amount of current flowing may also be controlled by proper selection of resistor 94. A full and complete description of the design considerations and circuit operation of constant current source 21 may be obtained by reference to U. S. Patent No. 2,663,806 issued December 22, 1953 to S. Darlington (see particularly Fig. 2).

As a first example of operation of the circuit of Fig. 3 with particular reference to current source 21 assume that output A of flip-flop 11 is in its high state as indicated at 110 on Fig. 4. The high state of output A tends to be slightly above ground potential, but is clamped by diode 95 becoming conductive. This keeps the potential of flip-flop output signal A essentially at ground. During the time when output A is in its high state, current is flowing from flip-flop 11 through diode 96 to constant current source 21. During this time the voltage across capacitor 97 remains constant and essentially at ground potential as shown at 111 on Fig. 4. If a control signal such as that at 112 on Fig. 4 is then applied to input 13 of flip-flop 11 the flip-flop output signals will change states, output A going to its low state as indicated at 113 on Fig. 4. When this occurs both diodes 95 and 96 will become non-conducting due to their anodes becoming negative with respect to their cathodes. The current drawn by current source 21 will then flow through capacitor 97 causing it to begin to acquire a charge which is negative at point R with respect to ground. Since the current drawn by current source 21 is constant, the charge developed across capacitor 97 will increase linearly as long as current flows through it as shown at 114 on Fig. 4.

Referring now more particularly to the operation of voltage comparator 16 the signal which is to be converted is applied directly to emitter 62 of transistor 61 while the reference to which the signal is being compared is developed across capacitor 97 as indicated in the preceding paragraph. When the voltage across capacitor 97 becomes essentially equal to that on emitter 62, transistor 61 produces an output pulse at collector 63 which is applied to input 12 of flip-flop 11. This pulse causes flip-flop 11 to reverse its state, so that the output signals return to their original states of operation, output A becoming high as indicated on 177 on Fig. 4.

The comparator output pulse or reset signal is produced in the following manner: transistor 61 is normally conducting in its quiescent condition which causes current to flow through primary winding 67 of transformer 66, and which in turn causes a magnetic field to build up around primary winding 67. The amount of current flowing is controlled by selection of resistor 75. When the voltage developed across capacitor 97 becomes equal to or slightly more than the voltage on emitter 62, transistor 61 begins to become non-conducting. This is caused by diode 76 becoming conducting and applying the voltage present across capacitor 97 to base 64 of transistor 61. Prior to this occurring diode 76 was non-conducting and the voltage level of base 64 was equal to the voltage applied to emitter 62 if the emitter-base voltage drop of transistor 61 is neglected. This decrease in conduction causes the magnetic field which was built up around primary winding 67 of transformer 66 to begin to collapse. This in turn induces a potential in secondary winding 70 which appears at base 64 with such a polarity as to cause transistor 61 to conduct even less. This regeneration continues until transistor 61 becomes completely non-conducting, thus producing a positive going pulse at collector 63 due to the polarity markings as indicated on the windings of transformer 66.

Diode 74 which is connected across secondary winding 70 is poled such as to prevent overshoot from occurring on base 64 of transistor 61. If this diode were not used transistor 61 would tend to go into oscillation producing a series of negative and positive pulses at collector 63 which would be undesirable.

As indicated on Fig. 4 when control signal 112 is applied to flip-flop 11 capacitor 97 begins to charge and continues to charge until the voltage developed thereacross becomes equal to the analog signal which is being compared. At this point reset signal 116 is developed. During the period of time between the occurrence of control signal 112 and that of reset signal 116 flip-flop output signal A is in its low state as indicated at 113. During this same period of time as indicated at 36 on Fig. 2 flip-flop output signal B is in its high state during which output pulses such as those shown at 37 on Fig. 2 appear at output terminals 27.

If at a later time the analog signal which is to be compared increases in value in a negative direction as indicated at 118 on Fig. 4 and a control signal such as that shown at 121 is applied to input terminal 13 of flip-flop 11 the same procedure as above described will take place. That is, capacitor 97 charges as indicated at 122 until the charge thereacross becomes equal to the analog signal at which time a reset signal such as 123 is produced. Flip-flop output signal A is in its low state during this period of time as indicated at 124. During this same period of time flip-flop output signal B will be in its high state and output pulses will appear at terminals 27.

For a more detailed consideration of voltage comparator 16 reference may be made to co-pending U. S. patent application Serial No. 498,290 of Richard A. Day and Lee J. Bateman, filed March 31, 1955, and assigned to the assignee of the present application.

If the circuit as shown in Fig. 3 is to be used in an application where extreme accuracy is required certain disadvantages may result. The inherent voltage drop between emitter 62 and base 64 of transistor 61 causes some slight inaccuracy between the voltage to be compared and the charge across capacitor 97, thus causing the reset signal to be produced slightly prior to the actual time it should occur. Another disadvantage which may result is that the comparator as shown requires power supply 73 to be isolated from all other voltages within the circuit. Also, if power supply 93 were to vary, the current produced by constant current source 21 would vary accordingly, thus introducing some error.

Figure 5:
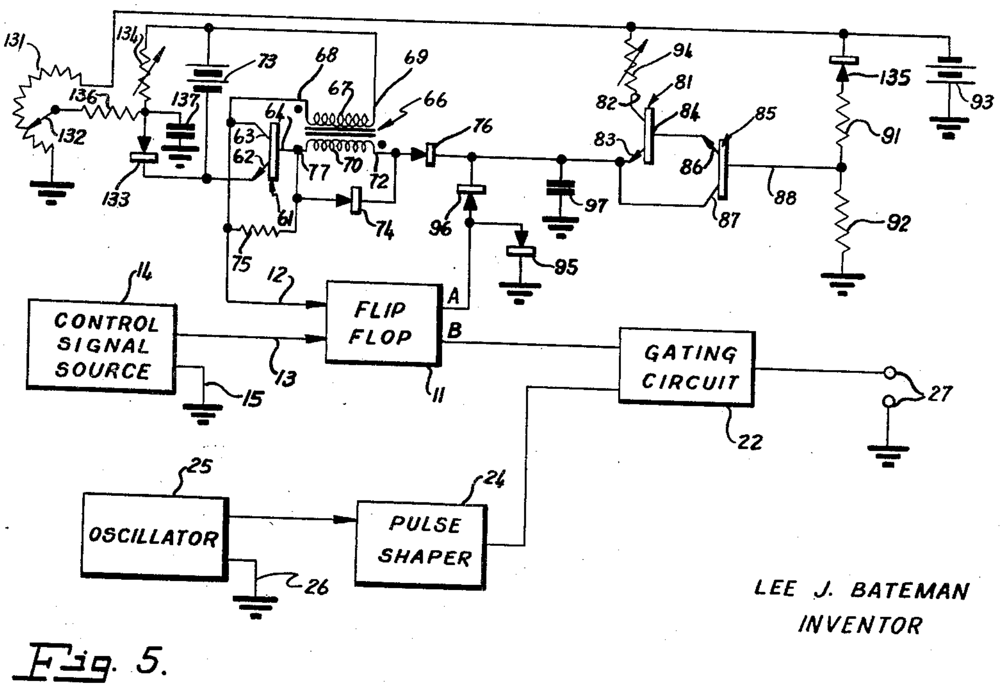
Fig. 5 is a schematic circuit diagram, partly block form, illustrating the preferred embodiment of the analog-to-digital converter of the present invention.

Reference is now made more particularly to the circuit of Fig. 5. This circuit is designed to compensate for the disadvantages as outlined above and may be used to accurately convert a direct-current voltage level or a shaft position into a true digital representation. The circuit of Fig. 5 shows a potentiometer 131 connected between the negative terminal of battery 93 and ground. Potentiometer 131 has a slideable arm 132 in contact therewith. The arm 132 may be moved by an instrument or the like to develop a voltage to be converted. Connected to arm 132 is a resistor 136. Connected between resistor 136 and emitter 62 of the transistor 61 is a diode 133 which is used to compensate for the emitter-base voltage drop of transistor 61. Connected between resistor 136 and terminal 69 of transformer 66 is variable resistor 134. Capacitor 137 is connected between the junction between diode 133 and resistor 134 and ground.

In order to compensate for variations which may occur in the power supply voltage a diode 135 may be connected between the negative terminal of battery 93 and the voltage divider composed of resistors 91 and 92. In the particular circuit as shown a silicon diode operating at its Zener voltage was used. The voltage drop across the diode times the ratio between the resistors 91 and 92 should be made equal to the emitter-base drop of transistors 81 and 85. For example, if the voltage level of power supply 93 were to increase, the drop across potentiometer 131 would increase, thus causing an erroneous indication of shaft position. If no compensation is used, voltage comparator 16 would produce a reset signal at a time later than desired. However, through use of diode 135 constant current source 21 is caused to produce a larger current which charges capacitor 97 faster. This causes the reset signal to be produced at the desired time. Therefore, the effect of any variations which may occur in the voltage of supply 93 will tend to be nullified by this circuit.

The combination of capacitor 137 and resistor 136 may be used for further compensation. The resistor-capacitor time constant possessed by these two components tends to cancel alternating-current variations within any practical range which may be present in power supply 93.

A variable resistor such as 94' may be connected between emitter 82 of transistor 81 and the negative terminal of battery 93 in order to provide an adjustment of the amplitude of the current supplied by source 21 and thus the scale factor for the charge of capacitor 97.

The remainder of the circuit as shown in Fig. 5 is identical to that of Fig. 3 and will operate in the same manner as above described to produce output pulses which are indicative of the voltage level present on arm 132 of potentiometer 131.

Although N–P–N transistors have been shown throughout the circuits of Figs. 3 and 5 by their conventional symbol it is to be understood that P–N–P transistors may be used by changing the polarities of all voltages and currents applied as hereinabove discussed.

The components within those parts of the circuits of Fig. 3 and Fig. 5 which are represented by rectangles are not critical and may be any of the standard circuits normally employed for performing the functions indicated by the various titles.

It will be understood that circuit specifications for the analog-to-digital converter of the present invention as shown in Fig. 5 may vary according to the design for any particular application. The following circuit specifications are included by way of example only, which are suitable for operation with a control signal having a pulse repetition rate of from zero to 500 cycles per second.

| | |
|---|---|
| Transistors **81** and **85** | N-P-N junction transistor, Texas Instruments type 904. |
| Transistor **61** | N-P-N junction transistor, Hughes Aircraft Company, developmental type. |
| Potentiometer **131** | 47,000 ohms. |
| Resistor **91** | 1,500 ohms. |
| Resistor **92** | 2,200 ohms. |
| Resistor **75** | 10,000 ohms. |
| Resistor **134** | 10,000 ohms. |
| Resistor **94** | 100,000 ohms. |
| Resistor **136** | 22,000 ohms. |
| Battery **73** | 1.35 volts. |
| Battery **93** | 35 volts. |
| Transformer **66** | Pacific Coast Associates type 101-1. |
| Diodes **133—74—95** | Hughes Aircraft Company type IN68. |
| Diodes **76—96** | Hughes Aircraft Company experimental type silicon diode. |
| Diode **135** | National Semiconductor type A4C. |
| Capacitor **97** | 0.1 micro-farad. |
| Capacitor **137** | 0.1 micro-farad. |

There have been thus disclosed several embodiments of an analog-to-digital converter which will accurately convert a voltage level or shaft position to a digital representation at relatively high speeds which employ transistors as active circuit elements and consume a small amount of power.

I claim.

1. An analog-voltage to digital-signal converter comprising: a flip-flop including first and second input terminals and first and second output terminals; a voltage comparator connected to said first input terminal; means for applying a control signal connected to said second input terminal for changing said flip-flop from one of its stable states to the other, said flip-flop being adapted to return to its original state upon application of a pulse from said comparator; a source of analog signals to be converted connected to said comparator; a constant current source connected to said comparator at a junction point; comparing control means including a first diode connected between said first flip-flop output terminal and said junction point, and a second diode connected between said first flip-flop output terminal and a point of fixed potential; charge storage means connected between said junction point and said point of fixed potential, said comparing control means being adapted to allow said charge storage means to assume a charge when said flip-flop is in one of its stable states and to discharge when said flip-flop is in the other one of its stable states, said comparator being adapted to produce an output pulse in response to the analog voltage and the charge across said charge storage means becoming substantially equal; gating means including an output terminal, said second flip-flop output terminal being connected to said gating means; and means for producing a continuously recurring signal connected to said gating means, whereby said recurring signal appears at said output of said gating means during the interval of time between the application of the control signal to said input terminal of said flip-flop and application of the pulse from said comparator to said first flip-flop input terminal.

2. An analog-voltage to digital-signal converter comprising: a flip-flop including first and second input terminals and first and second output terminals; a source of analog signals; a voltage comparator including a transistor, having an emitter, a base, and a collector, said collector being connected to said first flip-flop input terminal, said emitter being connected to said analog signal source; regenerative feedback means connected between said collector and said base; a source of potential connected between said feedback means and said emitter; and rectifying means connected between said feedback means and a junction point; means for applying a control signal connected to said second input terminal for changing said flip-flop from one of its stable states to the other, said flip-flop being adapted to return to its original state upon application of a pulse from said comparator; a constant current source connected to said comparator at said junction point; comparing control means connected between said first flip-flop output terminal and said junction point; charge storage means connected between said junction point and a point of fixed potential, said comparing control means being adapted to allow said charge storage means to assume a charge when said flip-flop is in one of its stable states and to discharge when said flip-flop is in the other one of its stable states, said comparator being adapted to produce an output pulse in response to the analog voltage and the charge across said charge storage means becoming substantially equal; gating means including an output terminal, said second flip-flop output terminal being connected to said gating means; and means for producing a continuously recurring signal connected to said gating means, whereby said recurring signal appears at said output of said gating means during the interval of time between the application of the control signal to said input terminal of said flip-flop and application of the pulse from said comparator to said first flip-flop input terminal.

3. The analog-voltage to digital-signal converter defined in claim 2 wherein said feedback means includes a transformer having a primary winding and including a first and second terminal and a secondary winding including a third and fourth terminal, said first terminal being connected to said collector, said source of potential being connected between said second terminal and said emitter, said third terminal being connected to said base, said fourth terminal being connected to said rectifying means; a diode connected between said third and fourth terminals for suppressing overshoot in said secondary winding; and a resistive impedance element connected between said second and third terminals.

4. An analog-voltage to digital-signal converter comprising: a flip-flop including first and second input terminals and first and second output terminals; a voltage comparator connected to said first input terminal; means for applying a control signal connected to said second input terminal for changing said flip-flop from one of its stable states to the other, said flip-flop being adapted to return to its original state upon application of a pulse from said comparator; a source of analog signals to be converted connected to said comparator; a constant current source connected to said comparator at a junction point, said constant current source including a first transistor having a first emitter, a first collector, and a first base; a second transistor having a second emitter, a second base; and a second collector, said first and second collectors being interconnected, said first emitter being connected to said second base; a source of potential having first and second terminals, said second terminal being connected to a point of fixed potential; first and second resistive impedance elements connected in series between said first terminal of said source of potential and said point of fixed potential; a third resistive impedance element connected between said source of potential and said second emitter; and said first base being connected to the junction between said first and second resistive impedance elements; comparing control means connected between said first flip-flop output terminal and said junction point; charge storage means connected between said junction point and said point of fixed potential, said comparing control means being adapted to allow said charge storage means to assume a charge when said flip-flop is in one of its stable states and to discharge when said flip-flop is in the other one of its stable states, said comparator being adapted to produce an output pulse in response to the analog voltage and the charge across said charge storage means becoming substantially equal; gating means including an output terminal, said second flip-flop output terminal being connected to said gating means; and means for producing a continuously recurring signal connected to said gating means, whereby said recurring signal appears at said output of said gating means during the interval of time between the application of the control signal to said input terminal of said flip-flop and application of the pulse from said comparator to said first flip-flop input terminal.

5. The analog-voltage to digital-signal converter defined in claim 4 wherein said source of potential is common to said constant current source and said source of analog signals; means to compensate for variations in said source of potential including a semi-conductive silicon diode connected between said source of potential and said first resistive impedance element and having substantially the same characteristics as the emitter-to-base characteristics of said first and second transistors.

6. An analog-voltage to digital-signal converter comprising: a flip-flop including first and second input terminals and first and second output terminals; a voltage comparator connected to said first input terminal; means for applying a control signal connected to said second input terminal for changing said flip-flop from one of its stable states to the other, said flip-flop being adapted to return to its original state upon application of a pulse from said comparator; a source of analog signals to be converted connected to said comparator, said source of analog signal including a resistive impedance element connected between a source of potential and a point of fixed potential and having a slideable arm in contact therewith, and a diode connected between said slideable arm and said comparator to compensate for voltage discrepancies between the analog voltage and the voltage across said charge storage means; a constant current source connected to said comparator at a junction point; comparing control means connected between said first flip-flop output terminal and said junction point; charge storage means connected between said junction point and a point of fixed potential, said comparing control means being adapted to allow said charge storage means to assume a charge when said flip-flop is in one of its stable states and to discharge when said flip-flop is in the other one of its stable states, said comparator being adapted to produce an output pulse in response to the analog voltage and the charge across said charge storage means becoming substantially equal; gating means including an output terminal, said second flip-flop output terminal being connected to said gating means; and means for producing a continuously recurring signal connected to said gating means, whereby said recurring signal appears at said output of said gating means during the interval of time between the application of the control signal to said input terminal of said flip-flop and application of the pulse from said comparator to said first flip-flop input terminal.

7. An analog-voltage to digital-signal converter comprising: a flip-flop including first and second input terminals and first and second output terminals; a voltage comparator connected to said first input terminal; means for applying a control signal connected to said second input terminal for changing said flip-flop from one of its stable states to the other, said flip-flop being adapted to return to its original state upon application of a pulse from said comparator; a source of analog signals to be converted including a first resistive impedance element connected between a source of potential and a point of fixed potential, and having a slideable arm in contact therewith; a second resistive impedance element and a capacitor connected in series between said slideable arm and said point of fixed potential for compensating for alternating-current variations within said source of potential; and a semiconductor diode connected between the junction between said second resistive impedance element and said capacitor and said comparator to compensate for voltage discrepancies between the analog voltage and the voltage across said charge storage means; a constant current source connected to said comparator at a junction point; comparing control means connected between said first flip-flop output terminal and said junction point; charge storage means connected between said junction point and said point of fixed potential, said comparing control means being adapted to allow said charge storage means to assume a charge when said flip-flop is in one of its stable states and to discharge when said flip-flop is in the other one of its stable states, said comparator being adapted to produce an output pulse in response to the analog voltage and the charge across said charge storage means becoming substantially equal; gating means including an output terminal, said second flip-flop output terminal being connected to said gating means; and means for producing a continuously recurring signal connected to said gating means, whereby said recurring signal appears at said output of said gating means during the interval of time between the application of the control signal to said input terminal of said flip-flop and application of the pulse from said comparator to said first flip-flop input terminal.

References Cited in the file of this patent

UNITED STATES PATENTS

| | | |
|---|---|---|
| 2,451,044 | Pierce | Oct. 2, 1948 |
| 2,539,623 | Heising | Jan. 30, 1951 |
| 2,700,501 | An Wang | Jan. 25, 1955 |
| 2,717,994 | Dickinson | Sept. 13, 1955 |
| 2,754,503 | Forbes | July 10, 1956 |
| 2,761,968 | Kuder | Sept. 4, 1956 |